United States Patent
Lin

(10) Patent No.: US 10,019,186 B2
(45) Date of Patent: *Jul. 10, 2018

(54) DATA MAINTENANCE METHOD FOR ERROR CONTROL AND DATA STORAGE DEVICE USING THE SAME

(71) Applicant: Silicon Motion, Inc., Jhubei (TW)

(72) Inventor: Wen-Sheng Lin, Kaohsiung (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/692,725

(22) Filed: Aug. 31, 2017

(65) Prior Publication Data

US 2018/0011648 A1   Jan. 11, 2018

Related U.S. Application Data

(63) Continuation of application No. 15/009,503, filed on Jan. 28, 2016, now Pat. No. 9,778,867.

(30) Foreign Application Priority Data

Feb. 5, 2015  (TW) .............................. 104103832 A

(51) Int. Cl.
  *G11C 11/56*  (2006.01)
  *G06F 3/06*  (2006.01)

(52) U.S. Cl.
  CPC ............ *G06F 3/0619* (2013.01); *G06F 3/061* (2013.01); *G06F 3/0655* (2013.01); *G06F 3/0688* (2013.01); *G11C 11/5628* (2013.01); *G11C 11/5642* (2013.01); *G11C 2211/5641* (2013.01); *G11C 2211/5646* (2013.01)

(58) Field of Classification Search
  CPC .... G06F 3/0619; G06F 3/0688; G06F 3/0655; G06F 3/061; G11C 11/5628; G11C 11/5642; G11C 2211/5641; G11C 2211/5646
  See application file for complete search history.

(56) References Cited

U.S. PATENT DOCUMENTS

| | | | | |
|---|---|---|---|---|
| 2007/0285980 A1* | 12/2007 | Shimizu | .............. | G11C 11/5628 365/185.03 |
| 2009/0248952 A1* | 10/2009 | Radke | ................. | G11C 11/5628 711/100 |
| 2012/0014186 A1* | 1/2012 | Li | ........................ | G11C 11/5628 365/185.25 |
| 2013/0117634 A1* | 5/2013 | Joo | ........................ | H03M 13/05 714/770 |

* cited by examiner

*Primary Examiner* — Khamdan Alrobaie
(74) *Attorney, Agent, or Firm* — Wang Law Firm, Inc.

(57) ABSTRACT

The present invention provides a data storage device including a flash memory and a controller. The flash memory has a plurality of single-level-cell units and a plurality of triple-level cell units. The controller performs a first predetermined number of read processes on a second predetermined number of specific single-level-cell units to program data stored in the second predetermined number of specific single-level-cell units into a specific triple-level cell unit of the triple-level cell units and determines whether any of the second predetermined number of specific single-level-cell units has not been read successfully by any of the read processes when the specific triple-level cell unit cannot be read successfully.

12 Claims, 4 Drawing Sheets

DATA MAINTENANCE METHOD FOR ERROR CONTROL AND DATA STORAGE DEVICE USING THE SAME

CROSS REFERENCE TO RELATED APPLICATIONS

This Application is a continuation of U.S. application Ser. No. 15/009,503, filed on Jan. 28, 2016, and claims priority to Taiwan Patent Application No. 104103832, filed on Feb. 5, 2015, the entirety of which is incorporated by reference herein.

BACKGROUND OF THE INVENTION

Field of the Invention

The present invention relates to a data maintenance method of a data-storage device, and in particular to a data maintenance method related to triple-level cell units.

Description of the Related Art

Flash memory is considered a non-volatile data-storage device that uses electrical methods to erase and program itself. NAND Flash, for example, is often used in memory cards, USB flash devices, solid state devices, eMMCs, and other memory devices.

Flash memory such as NAND Flash uses a multiple-block structure to store data. Each block contains multiple pages. Due to the possibility of errors occurring during the flash memory data storage procedure, the system now encodes the original data then stores the encoded data into flash memory; when data is read, the encoded data is first extracted then decoded back into the original data. Even though the encoding and decoding procedure can decrease errors, this procedure is still limited in correcting parts of bit errors. When the number of errors exceeds a certain value, the flash memory controller realizes it is unable to decode the data effectively when proceeding with the decoding procedures. Moreover, the flash memory marks each of the unable pages or blocks as a bad page or bad block to eliminate the page or block. Therefore, memory space is reduced.

BRIEF SUMMARY OF THE INVENTION

A detailed description is given in the following embodiments with reference to the accompanying drawings.

The present invention provides a data storage device. The data storage device includes a flash memory and a controller. The flash memory has a plurality of single-level-cell units and a plurality of triple-level cell units. The controller performs a first predetermined number of read processes on a second predetermined number of specific single-level-cell units of the single-level-cell units to program data of the second predetermined number of specific single-level-cell units into a specific triple-level cell unit of the triple-level cell units, checks whether the specific triple-level cell unit can be read successfully after the second predetermined number of specific single-level-cell units are programmed into the specific triple-level cell unit, and determines whether any of the second predetermined number of specific single-level-cell units has not been read successfully by any of the read processes when the specific triple-level cell unit cannot be read successfully.

The present invention further provides a data maintenance method applied to a data storage device, wherein the data storage device includes a flash memory having a plurality of single-level-cell units and a plurality of triple-level cell units. The data maintenance method includes; performing a first predetermined number of read processes on a second predetermined number of specific single-level-cell units of the single-level-cell units to program data of the second predetermined number of specific single-level-cell units into a specific triple-level cell unit of the triple-level cell units; checking whether the specific triple-level cell unit can be read successfully; and determining whether any of the second predetermined number of specific single-level-cell units has not been read successfully by any of the first predetermined number of read processes when the specific triple-level cell unit cannot be read successfully.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
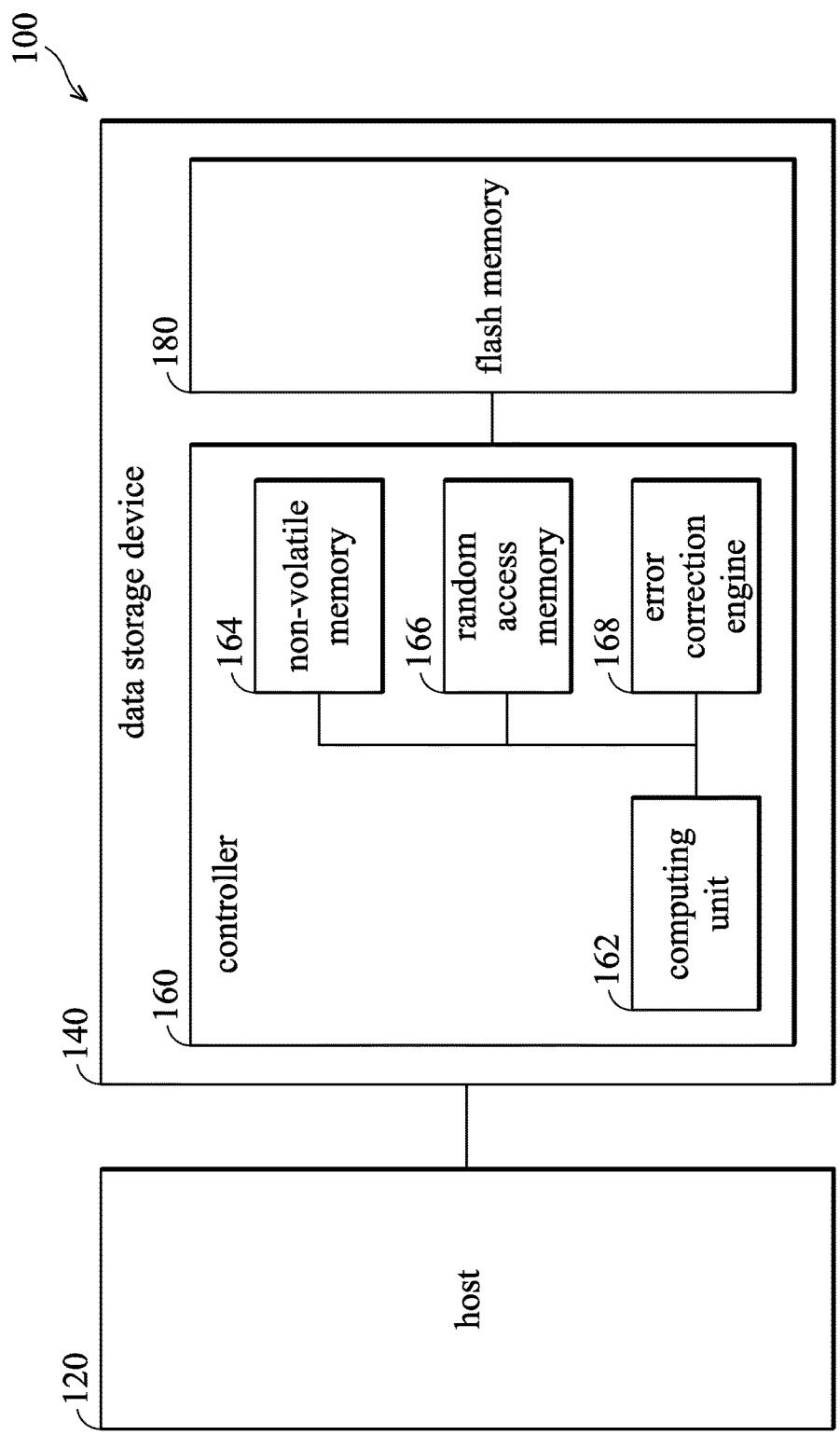
FIG. 1 is a schematic diagram illustrating an embodiment of an electronic system of the present invention.

FIG. 1 is a schematic diagram illustrating an embodiment of an electronic system of the present invention. The electronic system 100 includes a host 120 and a data storage device 140. The data storage device 140 includes a flash memory 180 and a controller 160, and operates in response to the commands of the host 110. The controller device 160 includes a computing unit 162, a random access memory 166 (RAM), a non-volatile memory, such as read only memory 164 (ROM) and an error correction engine 168. The non-volatile memory 164, the program code stored in the non-volatile memory 164 and data stored in the non-volatile memory 164 constitute firmware executed by the processing unit 162, and the controller 160 is configured to control the flash memory 180 based on the firmware. The random access memory 166 (RAM) is arranged to load program codes and parameters arranged to be provided to the controller 160 to operate. The error correction engine 168 is arranged to perform error correction on the retrieved data from the flash and encode the data arranged to be written into the flash memory 180 to obtain the corresponding parity.

Figure 2:
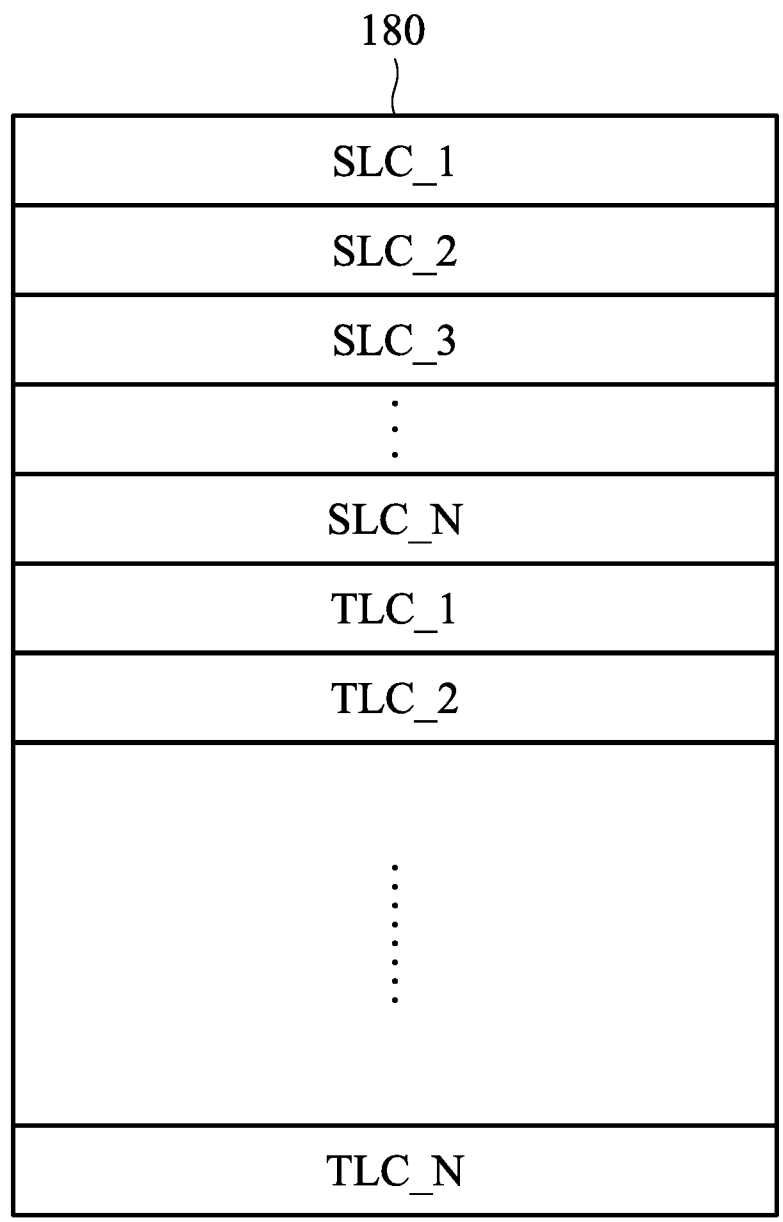
FIG. 2 is a schematic diagram illustrating an embodiment of a flash memory of the present invention.

The flash memory 180 includes a plurality of single-level-cell units SLC_1~SLC_N and a plurality of triple-level cell units TLC_1~TLC_N, as shown in FIG. 2. It should be noted that each of the single-level-cell units SLC_1~SLC_N and each of the triple-level cell units TLC_1~TLC_N can be a page, a block or a plurality of pages, it is not limited thereto. It should be noted that the flash memory 180 of the present invention stores user data in the triple-level cell units (TLC) mode and includes a plurality of single-level-cell units (SLC). Specifically, before the data is stored into a triple-level cell unit, the data need to be store to a predetermined number of corresponding single-level-cell units first. In the process of storing data, the controller 160 is configured to perform a first predetermined number of read processes on a second predetermined number of specific single-level-cell units of the single-level-cell units SLC_1~SLC_N to program the data of the specific single-level-cell units into a specific triple-level cell unit of the triple-level cell units TLC_1~TLC_N. Specifically, when the controller 160 is required to write data into a specific triple-level cell unit of the flash memory 180, the controller 160 writes the data into a second predetermined number of specific single-level-cells units of the single-level-cell units SLC_1~SLC_N first, and the controller 160 performs a first predetermined number of read processes on the specific single-level-cell units to program the data read by the first predetermined number of read processes of the specific single-level-cells into a specific triple-level cell unit for storing data into the specific triple-level cell unit.

Figure 3:
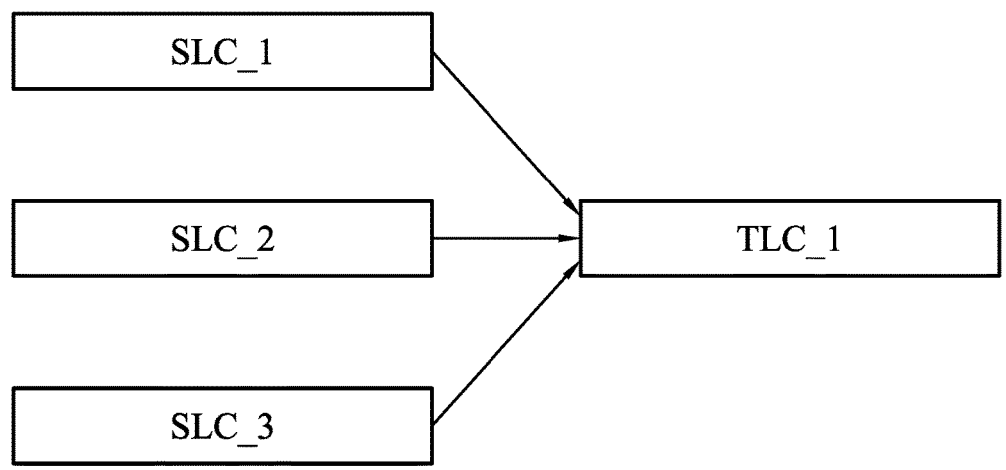
FIG. 3 is a schematic diagram illustrating an embodiment of cell units of the present invention.

In one of the embodiments, the first predetermined number and the second predetermined number are 3, but it is not limited thereto. For example, the controller 160 is required to write data into a specific triple-level cell unit TLC_1 of the flash memory 180, as shown in FIG. 3. First, the controller 160 divides the data to writes the data into the three specific single-level-cell units SLC_1~SLC_3. Next, the controller 160 performs a first read process on the specific single-level-cell units SLC_1~SLC_3 and programs the specific triple-level cell unit TLC_1 according to the data read from the specific single-level-cell units SLC_1~SLC_3 for the first time. Next, the controller 160 performs a second read process on the specific single-level-cell units SLC_1~SLC_3 and programs the specific triple-level cell unit TLC_1 according to the data read from the specific single-level-cell units SLC_1~SLC_3 for the second time. In the final step, the controller 160 performs a third read process on the specific single-level-cell units SLC_1~SLC_3 and programs the specific triple-level cell unit TLC_1 according to the data read from the specific single-level-cell units SLC_1~SLC_3 for the third time. The data of the single-level-cell units SLC_1~SLC_3 is written into the specific triple-level cell unit TLC_1 by the three incidents of programming.

It should be noted that, in the read processes, the controller 160 is further configured to write a predetermined value into a flag when the data of specific single-level-cell units cannot be read successfully. Namely, the controller 160 writes the predetermined value into the flag when any of the read processes is fails to read the data of the specific single-level-cell units. Specifically, the controller 160 retrieves the data of the second predetermined number of specific single-level-cell units and enables the error correction engine 168 to perform error correction on the retrieved data for programming the specific triple-level cell unit. When the error correction engine 168 cannot successfully correct the retrieved data, the specific single-level-cell units cannot be read successfully, and the controller 160 writes a predetermined value into the flag, wherein the flag has a default value. For example, the default value can be "0" and the predetermined value can be "1", but it is not limited thereto. In one of the embodiments, the flag is implemented in the non-volatile memory 164 or the random access memory of the controller 160 to record whether the data of the specific single-level-cell units has not been read successfully. Namely, the flag can be implemented in the firmware, but it is not limited thereto. In other embodiments, the flag can be implemented in the flash memory 180.

Moreover, the controller 160 is further configured to check whether the specific triple-level cell unit can be read successfully after programming the data of the specific single-level-cell units into the specific triple-level cell unit. When the specific triple-level cell unit can be read successfully, the controller 160 keeps the specific triple-level cell unit. When the specific triple-level cell unit cannot be read successfully, the controller 160 is further configured to determine whether any of the second predetermined number of specific single-level-cell units has not been read successfully. Specifically, the controller 160 retrieves the data of the specific triple-level cell unit and enables the error correction engine 168 to perform error correction on the retrieved data, wherein the specific triple-level cell unit cannot be read successfully when the error correction engine 168 cannot successfully correct the retrieved data. In one of the embodiments, the controller 160 determines whether any of the specific single-level-cell units has not been read successfully by any read processes according to the flag. Specifically, when the flag is the predetermined value, the controller 160 determines that at least one of the specific single-level-cell units has not been read successfully by at least one of the read processes. When the flag is the default value, the controller 160 determines that all of the specific single-level-cell units have been read successfully by the read processes.

When any of the specific single-level-cell units has not be read successfully by any of the read processes, the controller 160 keeps the specific triple-level cell unit. Specifically, when any of the specific single-level-cell units has not been read successfully by the read processes, this means that the reason for the read failure of the specific triple-level cell unit can be damage in the specific single-level-cell units. Therefore, the controller 160 keeps the specific triple-level cell unit. When all of the specific single-level-cell units have been read successfully by the read processes, the controller 160 marks the specific triple-level cell unit as a bad unit. Specifically, when all of the specific single-level-cell units have been read successfully by the read processes, this means that the reason for the read failure of the specific triple-level cell unit is not the damage of the specific single-level-cell units. Therefore, the controller 160 marks the specific triple-level cell unit as a bad unit.

Figure 4:
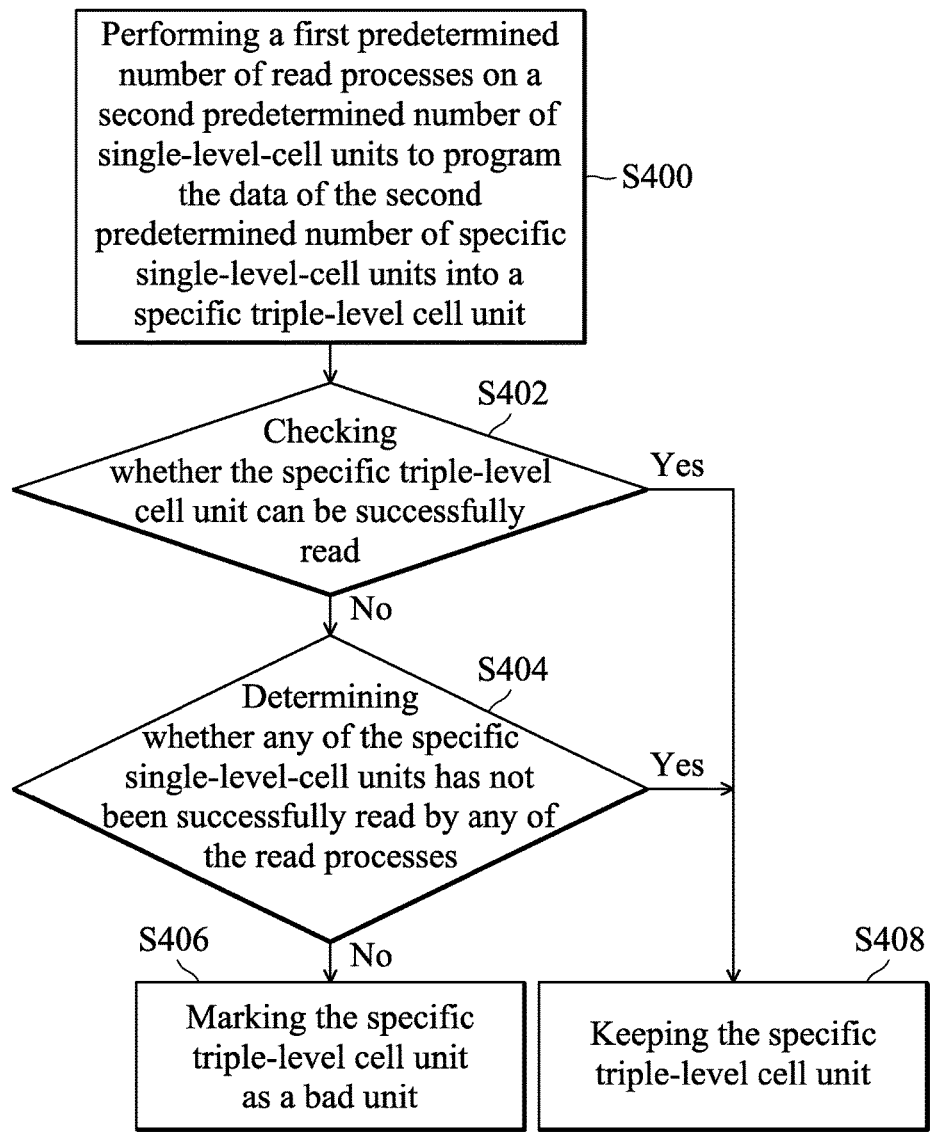
FIG. 4 is a flowchart of a data maintenance method according to an embodiment of the present invention.

FIG. 4 is a flowchart of a data maintenance method according to an embodiment of the present invention. The data maintenance method is applied to the data storage device 140 of FIG. 1. The process starts at step S400.

In step S400, the controller 160 is configured to perform a first predetermined number of read processes on a second predetermined number of single-level-cell units SLC_1~SLC_N to program the data of the second predetermined number of specific single-level-cell units into a specific triple-level cell unit of the triple-level cell units TLC_1~TLC_N. Specifically, when the controller 160 is required to write data into a specific triple-level cell unit of the flash memory 180, the controller 160 writes the data into a second predetermined number of specific single-level-cells units of the single-level-cell units SLC_1~SLC_N first. Next, the controller 160 performs a first predetermined number of read processes on the specific single-level-cell units to program the data read by the first predetermined number of read processes of the specific single-level-cells into a specific triple-level cell unit for storing data into the specific triple-level cell unit. In one embodiment, the first predetermined number and the second predetermined number are 3, but it is not limited thereto. The above description can be referred to for further details.

It should be noted that, in the read processes, the controller 160 is configured to write a predetermined value into a flag when the data of specific single-level-cell units cannot be read successfully. Namely, the controller 160 writes the predetermined value into the flag when any of the read processes fails to read the data of the specific single-level-cell units. Specifically, the controller 160 retrieves the data of the second predetermined number of specific single-level-cell units and enables the error correction engine 168 to perform error correction on the retrieved data for programming the specific triple-level cell unit. When the error correction engine 168 cannot successfully correct the retrieved data, the specific single-level-cell units cannot be read successfully, and the controller 160 writes a predetermined value into the flag, wherein the flag has a default value. For example, the default value can be "0" and the predetermined value can be "1", but it is not limited thereto.

In step S402, the controller 160 is configured to check whether the specific triple-level cell unit can be read successfully after programming the data of the specific single-level-cell units into the specific triple-level cell unit. When the specific triple-level cell unit can be read successfully, the process goes to step S408, otherwise, the process goes to step S404.

In step S404, the controller 160 determines whether any of the specific single-level-cell units has not been read successfully by any of the read processes. Specifically, the controller 160 retrieves the data of the specific triple-level cell unit and enables the error correction engine 168 to perform error correction on the retrieved data, wherein the specific triple-level cell unit cannot be read successfully when the error correction engine 168 cannot successfully correct the retrieved data. In one of the embodiments, the controller 160 determines whether any of the specific single-level-cell units has not been read successfully by any read processes according to the flag. Specifically, when the flag is the predetermined value, the controller 160 determines that at least one of the specific single-level-cell units has not been read successfully by at least one of the read processes. When the flag is the default value, the controller 160 determines that all of the specific single-level-cell units have been read successfully by the read processes. When any of the specific single-level-cell units has not been read successfully by any of the read processes, the process goes to step S408, otherwise, the process goes to step S406.

In step S406, the controller 160 marks the specific triple-level cell unit as a bad unit. Specifically, when any of the specific single-level-cell units has not been read successfully by the read processes, this means that the reason for the read failure of the specific triple-level cell unit can be the damage of the specific single-level-cell units. Therefore, the controller 160 keeps the specific triple-level cell unit. The process ends at step S406.

In step S408, the controller 160 keeps the specific triple-level cell unit. Specifically, when all of the specific single-level-cell units have been read successfully by the read processes, this means that the reason for the read failure of the specific triple-level cell unit is not the damage of the specific single-level-cell units. Therefore, the controller 160 marks the specific triple-level cell unit as a bad unit. The process ends at step S408.

As described above, the data storage device 140 and the data maintenance method of the various embodiments can determine whether the single-level-cell units which are arranged to be programmed into a triple-level cell unit can be read successfully for determining whether the triple-level cell unit is damaged.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, having a plurality of single-level-cell units and a plurality of triple-level cell units; and
   a controller, performing to keep a specific triple-level cell unit of the triple-level cell units or mark the specific triple-level cell unit as a bad unit by checking whether the specific triple-level cell unit can be read successfully after the specific triple-level cell unit has been programmed by data read from a predetermined number of the single-level-cell units, and by determine whether any of the predetermined number of the single-level-cell units has not been read successfully when the specific triple-level cell unit cannot been read successfully.

2. The data storage device as claimed in claim 1, wherein the controller keeps the specific triple-level cell unit when the specific triple-level cell unit can be read successfully.

3. The data storage device as claimed in claim 1, wherein the controller keeps the specific triple-level cell unit when any of the predetermined number of the single-level-cell units has not been read successfully.

4. The data storage device as claimed in claim 1, wherein the controller marks the specific triple-level cell unit as the bad unit when all of the predetermined number of the single-level-cell units have been read successfully.

5. The data storage device as claimed in claim 1, wherein the controller writes a predetermined value into a flag when any of the predetermined number of the single-level-cell units cannot be read successfully.

6. The data storage device as claimed in claim 5, wherein the controller determines whether any of the predetermined number of the single-level-cell units has not been read successfully according to the flag.

7. A data maintenance method, applied to a data storage device, wherein the data storage device comprises a flash memory having a plurality of single-level-cell units and a plurality of triple-level cell units, the data maintenance method comprising:

checking whether a specific triple-level cell unit of the triple-level cell units can be read successfully after the specific triple-level cell unit has been programmed by data read from a predetermined number of the single-level-cell units; and determining whether any of the predetermined number of the single-level-cell units has not been read successfully when the specific triple-level cell unit cannot be read successfully.

8. The data maintenance method as claimed in claim 7, further comprising keeping the specific triple-level cell unit when the specific triple-level cell unit can be read successfully.

9. The data maintenance method as claimed in claim 7, further comprising keeping the specific triple-level cell unit when any of the predetermined number of the single-level-cell units has not been read successfully.

10. The data maintenance method as claimed in claim 7, further comprising marking the specific triple-level cell unit as a bad unit when all of the predetermined number of the single-level-cell units have been read successfully.

11. The data maintenance method as claimed in claim 7, further comprising writing a predetermined value into a flag when any of the predetermined number of the single-level-cell units cannot be read successfully.

12. The data maintenance method as claimed in claim 11, wherein the step of determining whether any of the predetermined number of the single-level-cell units has not been read successfully is according to the flag.

\* \* \* \* \*